(12) United States Patent
Liu et al.

(10) Patent No.: US 9,875,913 B2
(45) Date of Patent: Jan. 23, 2018

(54) METHOD FOR SINGULATING PACKAGED INTEGRATED CIRCUITS AND RESULTING STRUCTURES

(71) Applicant: Taiwan Semiconductor Manufacturing Company, Ltd., Hsin-Chu (TW)

(72) Inventors: Ming-Kai Liu, New Taipei (TW); Yen-Ping Wang, Hemei Township (TW); Kai-Chiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 77 days.

(21) Appl. No.: 14/067,644

(22) Filed: Oct. 30, 2013

(65) Prior Publication Data

US 2015/0118797 A1   Apr. 30, 2015

(51) Int. Cl.
  *H01L 21/00* (2006.01)
  *H01L 21/56* (2006.01)
  *H01L 21/78* (2006.01)
  *H01L 23/31* (2006.01)

(52) U.S. Cl.
  CPC .......... *H01L 21/565* (2013.01); *H01L 21/561* (2013.01); *H01L 21/78* (2013.01); *H01L 23/3114* (2013.01); *H01L 2224/13* (2013.01)

(58) Field of Classification Search
  None
  See application file for complete search history.

(56) References Cited

U.S. PATENT DOCUMENTS

| | | | | |
|---|---|---|---|---|
| 4,878,992 A * | 11/1989 | Campanelli | ............ | B23D 61/10 156/250 |
| 6,074,896 A * | 6/2000 | Dando | ................ | H01L 21/6836 257/E21.599 |
| 6,291,270 B1 * | 9/2001 | Saito | ..................... | H01L 21/565 257/E21.504 |
| 6,987,054 B2 * | 1/2006 | Fukasawa | ............... | H01L 21/56 257/E21.502 |
| 7,250,354 B2 * | 7/2007 | Uchida | ............... | H01L 21/6835 257/E21.238 |
| 2002/0031899 A1 * | 3/2002 | Manor | ............... | B23K 26/0093 438/460 |
| 2002/0050631 A1 * | 5/2002 | Minamio | ............ | H01L 23/3128 257/678 |

(Continued)

*Primary Examiner* — Whitney T Moore
*Assistant Examiner* — Herve Assouman
(74) *Attorney, Agent, or Firm* — Slater Matsil, LLP

(57) ABSTRACT

A method of packaging an integrated circuit includes forming a first integrated circuit and a second integrated circuit on a wafer, the first and second integrated circuit separated by a singulation region. The method includes covering the first and second integrated circuits with a molding compound, and sawing through a top portion of the molding compound using a first beveled saw blade, while leaving a bottom portion of the molding compound remaining. The method further includes sawing through the bottom portion of the molding compound and the wafer using a second saw blade, the second saw blade having a thickness that is less than a thickness of the first saw blade. The resulting structure is within the scope of the present disclosure.

20 Claims, 3 Drawing Sheets

(56) References Cited

U.S. PATENT DOCUMENTS

| | | | | |
|---|---|---|---|---|
| 2004/0018713 A1* | 1/2004 | Hiatt | ............ | H01L 21/6836 |
| | | | | 438/612 |
| 2004/0238926 A1* | 12/2004 | Obinata | ............ | H01L 21/78 |
| | | | | 257/678 |
| 2005/0040523 A1* | 2/2005 | Hanaoka | ............ | H01L 21/74 |
| | | | | 257/734 |
| 2005/0148160 A1* | 7/2005 | Farnworth | ............ | H01L 21/6835 |
| | | | | 438/462 |
| 2010/0213599 A1* | 8/2010 | Watanabe | ............ | H01L 23/13 |
| | | | | 257/693 |
| 2011/0204513 A1* | 8/2011 | Meyer | ............ | H01L 24/96 |
| | | | | 257/738 |
| 2012/0126428 A1* | 5/2012 | Park | ............ | H01L 21/561 |
| | | | | 257/777 |
| 2013/0341800 A1* | 12/2013 | Tu | ............ | H01L 21/78 |
| | | | | 257/774 |

* cited by examiner

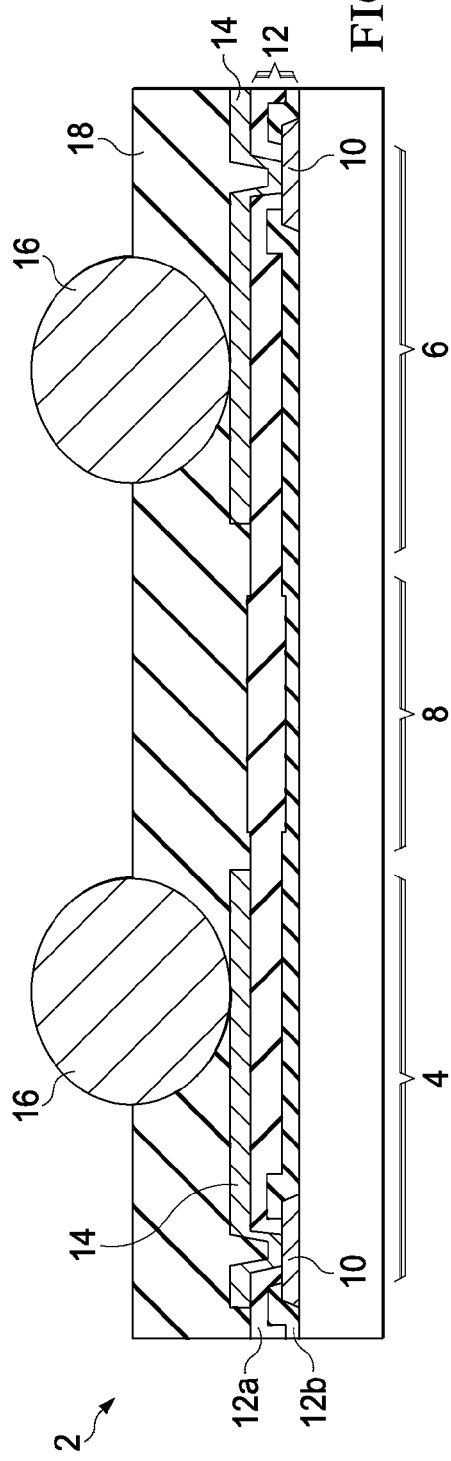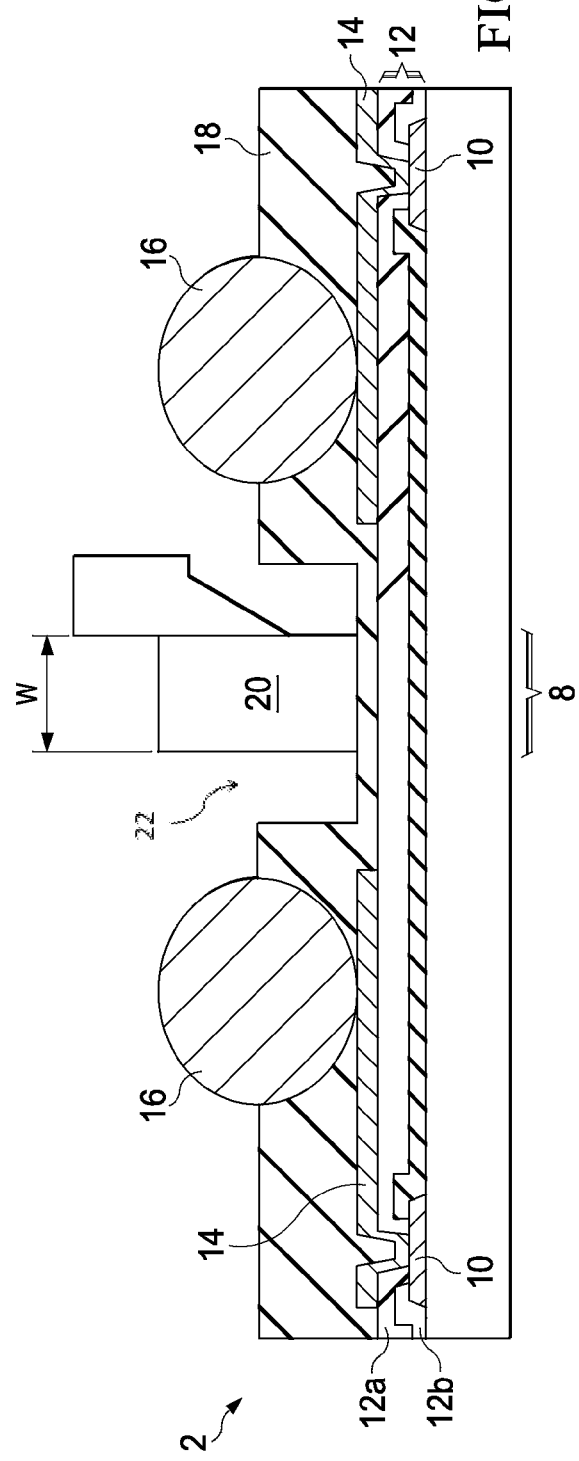

METHOD FOR SINGULATING PACKAGED INTEGRATED CIRCUITS AND RESULTING STRUCTURES

BACKGROUND

As the industry continues trending toward denser and denser integration of circuit and components, wafer level packaging is becoming increasingly employed. Multiple integrated circuit dies are manufactured on a common wafer, or substrate, and then packaged while still in wafer form. Packaging may include embedding the die in molding compound. After embedding, the individual die are singulated, e.g., by mechanically sawing through the molding compound and the wafer to singulate individual die. The singulation process can induce damage to the integrated circuit, however.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1-3 illustrate in cross-sectional view packaged integrated circuits formed on a common wafer in various stages of exemplary singulation processes.

DETAILED DESCRIPTION OF ILLUSTRATIVE EMBODIMENTS

Figure 3:
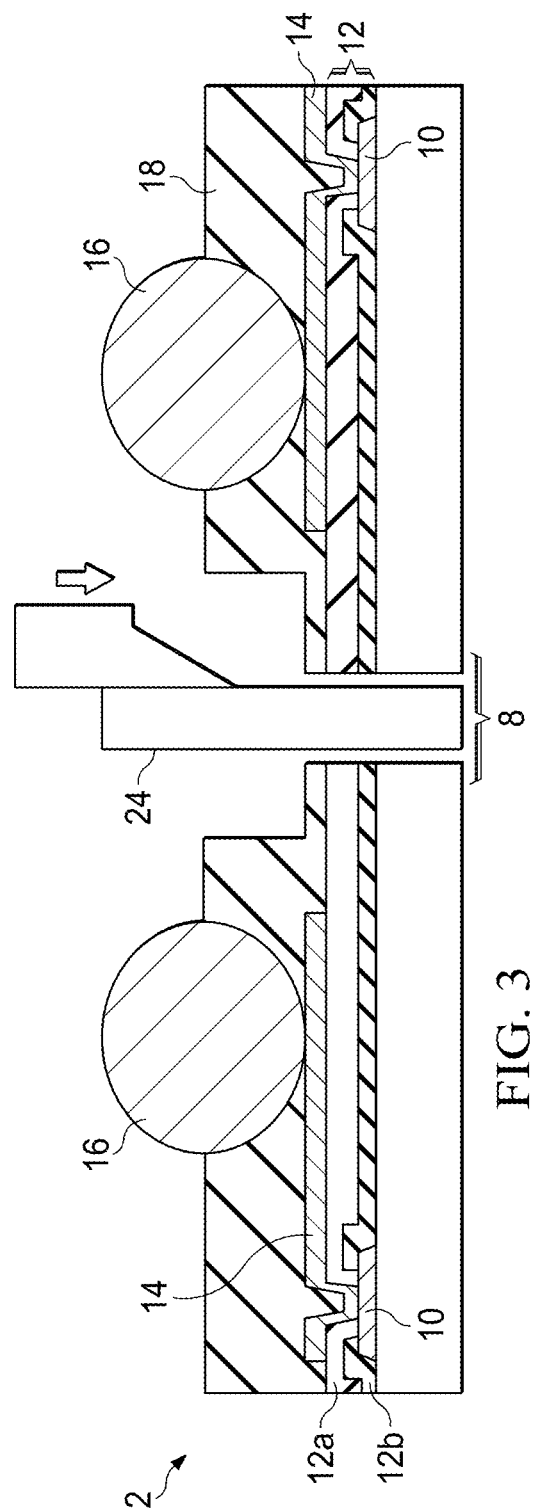

The making and forming of the present exemplary embodiments are discussed in detail below. It should be appreciated, however, that embodiments of the present disclosure provide many applicable concepts that can be embodied in a wide variety of specific contexts. The specific embodiments discussed are merely illustrative of specific ways to make and use the invention, and do not limit the scope of the applications.

The present disclosure will be described with respect to exemplary embodiments in a specific context, a method of singulating wafer scale packaged integrated circuit devices to minimize or avoid singulation induced damage.

FIG. 1 illustrates an exemplary structure 100 in cross sectional view. The structure includes wafer 2 in and upon which are formed first integrated circuit 4 and second integrated circuit 6. Wafer 2, sometimes referred to as a substrate, could be a silicon substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate is a semiconductor on insulator (SOI) substrate. The SOI substrate may include a buried oxide (BOX) layer formed by a process such as separation by implanted oxygen (SIMOX), and/or other suitable processes. The substrate may include doped regions, such as p-wells and n-wells. In the present disclosure, a wafer is a semiconductor substrate and various features formed in and over the semiconductor substrate. First integrated circuit 4 and second integrated circuit 6 are separated by scribe lines, also sometimes referred to herein as dicing lines and/or singulation regions 8. First integrated circuit 4 and second integrated circuit 6 are illustrated in a highly schematic and simplified form, as details beyond those illustrated are well known to those skilled in the art and are not necessary for an understanding of the present disclosure. For instance, although not illustrated, those skilled in the art will appreciate that first and/or second integrated circuit 4/6 will include doped regions and isolation regions formed within and/or upon wafer 2, polysilicon layers, and various metal layers and dielectric layers formed atop wafer 2. By way of example, and not by limitation, first integrated circuit 4, second integrated circuit 6, or both could be a logic device, a microprocessor device, a memory device, such as dynamic random access memory (DRAM) or static random access memory (SRAM), an RF device, a mixed signal device, or any other form of integrated circuit.

An exemplary contact pad 10 is illustrated for each integrated circuit, although in practice numerous contact pads will be provided for each integrated circuit. A passivation layer 12 is formed atop the contact pads 10 with openings formed therein to allow electrical and/or physical contact therethrough to the respective contact pads 10. In some embodiments, passivation layer 12 is a multi-layer structure and may include two layers, 12a and 12b, as in the illustrated embodiment. A patterned redistribution layer 14, sometimes referred to as a post-passivation interconnect, is atop passivation layer 12. Respective portions of patterned redistribution layer 14 make electrical and/or physical contact respective contact pads 10. Connectors 16 are formed on respective portions of patterned redistribution layer 14. Connectors 16 may be solder balls, solder bumps, copper pillars, or structurally and functionally similar connectors.

In the illustrated embodiment, connectors 16 are formed directly on and physically contacting respective portions of patterned redistribution layer 14. In other embodiments, so-called under bump metal (UBM) could be employed between connectors 16 and respective portions of patterned redistribution layer 14. It is believed that the presently described embodiments are particularly advantageous in so-called UBM free fan-out processes. While not being limited to any particular theory underlying the operation of methods described herein, it is believed that the novel sawing methods described herein are particularly useful for minimizing or preventing mechanical damage that would otherwise result in a UBM free fan-out process.

Molding compound 18 is formed atop first and second integrated circuits 4, 6 and atop singulation regions 18. In some embodiments molding compound 18 is a liquid molding compound such as R4600-2C80, available from Nagase ChemteX Corporation, Osaka, Japan. As known in the art, liquid molding compound can be applied in a liquid form to uniformly and completely coat and cover a wafer surface. The liquid molding compound is then cured to harden, i.e. solidify, it. Curing can include one or more of a heat treatment, a radiation treatment (e.g., UV curing), a chemical curing step in which a reactant is applied to the liquid molding compound, exposure to an environment (e.g. air), or the like. The solid mold compound provides mechanical protection and electrical insulation to the underlying integrated circuits, as well as protecting the integrated circuits from environmental conditions, e.g., moisture or corrosive chemicals. Other molding compounds are within the contemplated scope of the disclosures herein, including epoxies, polymers, plastics, ceramics, molding compounds, thermally conductive molding compounds, and the like. Note that connectors 16 extend above a top surface of molding compound 18 in order to provide for electrical contact to connectors 16. This can be accomplished via numerous ways, including forming molding compound 18 to thickness that is less than the height of connectors 16, or forming molding compound to cover connectors 16 and removing a portion of molding compound 18, through a mechanical process, a chemical process, or a combined chemical and mechanical process, to expose top portions of connectors 16.

Note that no connectors 16 are formed in singulation regions 8. Preferably, no portions of patterned redistribution layer 12 are formed in singulation regions either. This is because these regions will be mechanically sawed through in order to singulate, i.e. physically separate, integrated circuits 4 and 6, as will be described further below.

As is known in the art, one of the final steps in some wafer level packaging schemes is to singulate the individual integrated circuits. This is commonly accomplished by mechanically sawing in the singulation region from a top major surface of the molding compound through to the bottom of the wafer in order to physically separate the various packaged integrated circuits formed on the common wafer into separate structures. It is further known, however, that the process of sawing through the molding compound and wafer (and various layers formed on the wafer) frequently causes damage such as chipping of the (typically silicon) wafer surface. Delamination between the top layers of the integrated circuit and the molding compound also frequently occurs as a result of the sawing process.

FIGS. 2 and 3 illustrate steps in a novel process for mechanically separating adjacent packed integrated circuits while minimizing or avoiding concomitant damage to the devices. FIG. 2 illustrates the structure of FIG. 1, again in cross-sectional view, during a first sawing step. As shown, saw blade 20 is aligned to a singulation region 8. Saw blade 20 may be a conventional blade, such as provided by Disco Corporation, Tokyo, Japan. In a first sawing process, saw blade 20 saws through a top portion of molding compound 18, while leaving a bottom portion of molding compound remaining. In an exemplary embodiment, the remaining bottom portion of molding compound is between about 15 microns to about 35 microns in thickness after the first sawing process. Saw blade 20 may be formed of a high quality metal such as stainless steel. Saw blade 20 may have embedded on its cutting surfaces grit, including diamond particles or diamond-like carbon particles to aid the cutting process. In some embodiments saw blade 20 is a solid disc, whereas in other embodiments, saw blade 20 many be annularly shaped.

While not being limited to any particular theory underlying the operation of methods described herein, it is believed that the process of sawing through molding compound 18 causes the buildup of silica particles on saw blade 20. These silica particles can damage wafer 2 if saw blade 20 is used to saw through wafer 2. By sawing only partially through molding compound 18, and leaving a bottom portion of molding compound 18 remaining, it is believed that the buildup of silica particles on saw blade 20 will not cause damage to wafer 2. Rather, a separate saw blade, free of silica particle buildup is used to saw through wafer 2, as described below.

Furthermore, in exemplary embodiments, saw blade 20 is a relatively wide, or thick, saw blade. The conventional wisdom is that the saw blade used to singulate packaged wafers should be a thin as possible in order to reduce mechanical damage to the device (particularly wafer 2) and in order to allow for a thin singulation region. The singulation region is not usable "real estate" on the wafer 2, and hence it is desirable to have a relatively thin singulation region in order to minimize the amount of wafer surface area, or "real estate" taken up by the singulation region. Contrary to conventional wisdom, however, saw blade 20 is significantly wider than a conventional saw blade. In an exemplary embodiment, saw blade 20 has a width w or thickness of 200 microns. Such a saw blade results in a kerf 22 having a width of about or slightly more than about 200 microns. For purposes of illustration, kerf 22 is shown much larger than saw blade 20. In actual practice, kerf 22 would be only slightly larger than saw blade 20 in width and other relevant dimensions. The difference in dimensions between kerf 22 and saw blade 20 is greatly exaggerated in the figures. In embodiments, the first blade may have a thickness of from about 40 microns to about 200 microns, with a kerf 22 being comparable, albeit slightly wider.

While not being tied to any particular theory, it is believed that the wide kerf resulting from use of a thick saw blade reduces the amount of molding compound volume in the region of the singulation. This reduction of volume of molding compound in this region may reduce the impact of mismatch between the coefficient of thermal expansion for molding compound 18, on the one hand, and substrate 2, on the other hand.

The result of the sawing operation is a cut line, or kerf, extending part way, but not completely, through molding compound 18 and any layers atop substrate 2, and extending only partly through substrate 2. FIG. 3 illustrates a next step in the singulation process. As shown, a second saw blade 24 is employed in a second sawing step to complete the singulation process. Second saw blade 24 is aligned to the kerf left by first saw blade 20, and is used to saw completely through the remaining bottom portion of molding compound 18, as well as through substrate 2. In the illustrated embodiment, saw blade 24 is significantly thinner than first saw blade 20. It is not necessary to provide a wide kerf in substrate 2, as such a wide kerf would not provide an advantage in removing the volume of molding compound from the singulation zone. In some embodiments, saw blade 24 is about 30 microns wide. In other embodiments, saw blade 24 is about 42 microns wide. Alternatively, saw blade 24 could be of substantially similar thickness as saw blade 20 in some embodiments. In some embodiments, saw blade 24 may have a thickness of from about 40 microns to about 200 microns. Saw blade 24 may be formed of a high quality metal such as stainless steel. Saw blade 24 may have embedded on its cutting surfaces grit, including diamond particles or diamond-like carbon particles to aid the cutting process. In some embodiments saw blade 24 is a solid disc, whereas in other embodiments, saw blade 24 many be annularly shaped.

Figure 4:
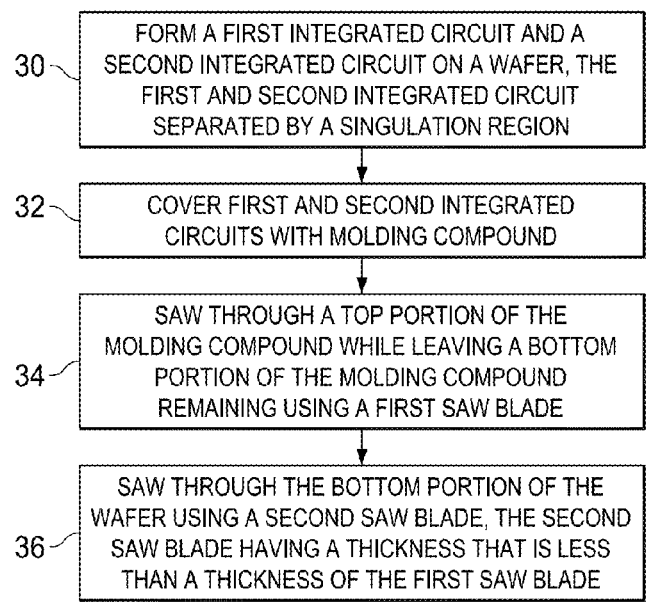
FIG. 4 is a flow chart of an exemplary method of forming a packaged integrated circuit.

FIG. 4 provides a flow chart of an exemplary method of forming a packaged integrated circuit. The method initiates at step 30 which includes forming a first integrated circuit and a second integrated circuit on a wafer, the first and second integrated circuit separated by a singulation region. In step 32, the first and second integrated circuits are covered with a molding compound. Step 34 includes sawing through a top portion of the molding compound while leaving a bottom portion of the molding compound remaining. Next, in step 36, the bottom portion of the molding compound and wafer are sawed through using a second saw blade, the second saw blade having a thickness that is less than a thickness of the first saw blade.

The present disclosure has described many exemplary embodiments of singulating packaged integrated circuits. Embodiments in the disclosure are only for illustrative purposes and are not limiting. The processes disclosed may be varied according to needs and the available technology at the time and still within the scope of the disclosure.

For instance, in some embodiments, the present disclosure provides for a method of packaging an integrated circuit that includes forming a first integrated circuit and a second integrated circuit on a wafer. The first and second integrated circuit are separated by a singulation region, sometimes referred to as a dicing region, a scribe region, a dicing street, a scribe line, a scribe street, or the like. The method includes covering the first and second integrated circuits with a molding compound. A top portion of the molding compound is sawed through with a first saw blade, while leaving a bottom portion of the molding compound remaining. The first saw blade has a first thickness. The method further includes sawing through the remaining bottom portion of the molding and the wafer using a second saw blade. The second saw blade has a thickness that is less than the thickness of the first saw blade.

In other embodiments, the present disclosure provides for a method of packaging an integrated circuit including forming a first integrated circuit on a wafer and a second integrated on the wafer. The first integrated circuit and second integrated circuit are separated by a singulation region. The method includes applying dicing tape to a side of the wafer opposite to the side on which the first integrated circuit and second integrated circuit are formed. The method also includes forming on a first major surface of the first integrated circuit a first electrical contact pad and forming on a second major surface of the second integrated circuit a second electrical contact pad, and forming a first connector on the first contact pad and a second connector on the second contact pad. The first major surface and the second major surface are covered with a molding compound, which extends over the singulation region. The method continues with aligning the wafer to a saw blade so that the saw blade is aligned to the singulation region, and sawing through a top portion of the molding compound with a saw blade having a first width. A bottom portion of the molding compound remains in the singulation region after the sawing step. The method further includes singulating the first integrated circuit and the second integrated circuit by sawing through the bottom portion of the molding compound and through the wafer with a second saw blade. The second saw blade has a second width that is less than the first width. At least a portion of the dicing tape remains in the singulation region after the singulating step.

In yet other embodiments, the present disclosure provides for a method of packaging an integrated circuit including providing a wafer having formed thereon a plurality of integrated circuits and a plurality of scribe lines separating adjacent integrated circuits. Each integrated circuit includes at least one contact pad formed on a top major surface thereof. Connectors are electrically connected to respective contact pads. The method includes forming a liquid molding compound over the wafer. The liquid molding compound covers top major surface of the respective integrated circuits and the scribe lines. The liquid molding compound is cured to solidify it. The method further includes aligning with a first scribe line, a first saw blade having a first thickness, and sawing through a top portion of the cured molding compound while leaving a bottom portion of the cured molding compound remaining. This forms a kerf in the top portion of the cured molding compound. A second saw blade is aligned to the kerf. The method includes sawing through the bottom portion of the cured molding compound and the wafer using the second saw blade. The second saw blade has a second thickness different from the first thickness.

What is claimed is:

1. A method of packaging an integrated circuit comprising:
   forming a first integrated circuit and a second integrated circuit on a wafer, the first and second integrated circuits being separated by a singulation region;
   forming a first redistribution layer on the first integrated circuit and forming a first connector on the first redistribution layer, and forming a second redistribution layer on the second integrated circuit and forming a second connector on the second redistribution layer;
   covering the first and second integrated circuits, the first redistribution layer and the second redistribution layer with a molding compound and at least partially covering the first connector and the second connector with the molding compound;
   sawing through a top portion of the molding compound while leaving a bottom portion of the molding compound remaining using a first saw blade having a first thickness, wherein the first saw blade has a solid disk shape, and wherein the solid disk shape is non-annular; and
   after sawing through the top portion of the molding compound, sawing through the bottom portion of the molding compound and the wafer using a second saw blade having a second thickness that is less than the first thickness, and wherein the second saw blade has an annular shape different than the solid disk shape of the first saw blade.

2. The method of claim 1, wherein the sawing comprises leaving about 15 microns to about 35 microns of molding compound remaining.

3. The method of claim 1, wherein the first thickness is about 40 microns to about 200 microns, and the second thickness is about 15 microns to about 25 microns.

4. The method of claim 1, wherein the covering the first and second integrated circuits with the molding compound comprises:
   depositing a liquid molding compound over the first and second integrated circuits; and
   curing the liquid molding compound.

5. The method of claim 1, wherein the covering the first and second integrated circuits with a molding compound comprises forming the molding compound to thickness of from about 80 microns to about 120 microns.

6. The method of claim 1, further comprising applying a dicing tape to a bottom surface of the wafer.

7. The method of claim 6, wherein a portion of the dicing tape remains between the first integrated circuit and the second integrated circuit after the step of sawing through the bottom portion of the molding compound and the wafer.

8. The method of claim 1, wherein the first thickness is about 200 microns, and the second thickness is about 42 microns.

9. A method of packaging an integrated circuit comprising:
   forming a first integrated circuit on a wafer and a second integrated circuit on the wafer, the first integrated circuit and second integrated circuit being separated by a singulation region;
   applying a dicing tape to a side of the wafer opposite to the side on which the first integrated circuit and second integrated circuit are formed;
   forming a first electrical contact pad on a first major surface of the first integrated circuit and forming a second electrical contact pad on a second major surface of the second integrated circuit;

forming a first connector on the first electrical contact pad and a second connector on the second electrical contact pad;

covering the first major surface and the second major surface with a molding compound, the molding compound extending over the singulation region;

aligning the wafer to a first saw blade so that the first saw blade is aligned to the singulation region;

before performing any sawing operation to the singulation region of the wafer, sawing through a top portion of the molding compound with the first saw blade having a first width, wherein a bottom portion of the molding compound remains in the singulation region after the sawing step, and wherein the first saw blade has an annular shape; and singulating the first integrated circuit and the second integrated circuit by sawing through the bottom portion of the molding compound and through the wafer with a second saw blade, the second saw blade having a second width that is less than the first width, wherein at least a portion of the dicing tape remains in the singulation region after the singulating step, wherein the second saw blade has a solid disk shape different than the annular shape of the first saw blade, and wherein the solid disk shape is non-annular.

10. The method of claim 9, wherein the bottom portion of the molding compound is at least 25 microns in thickness.

11. The method of claim 9, wherein the first width is at least five times greater than the second width.

12. The method of claim 9, wherein the first width is about 200 microns and the second width is about 30 microns.

13. The method of claim 9, wherein the first connector is selected from the group consisting of a solder ball, a solder bump, and a copper pillar.

14. The method of claim 9, wherein the first width is about 200 microns and the second width is about 42 microns.

15. The method of claim 9, wherein a shape of the first saw blade is the same as a shape of the second saw blade in a cross sectional view.

16. A method of packaging an integrated circuit comprising:

providing a wafer comprising a semiconductor substrate and having formed thereon a plurality of integrated circuits and a plurality of scribe lines separating adjacent integrated circuits, each integrated circuit including at least one contact pad formed on a top major surface thereof over the semiconductor substrate;

electrically connecting to the respective contact pads, respective connectors, wherein the electrically connecting to the respective contact pads respective connectors comprises:

forming a passivation layer over the contact pads;

forming a patterned redistribution layer over the passivation layer, portions of the patterned redistribution layer being in electrical contact with respective ones of the contact pads; and forming respective solder balls directly on and in physical contact with respective portions of the patterned redistribution layer;

forming a liquid molding compound over the wafer, the liquid molding compound covering the top major surface of the respective integrated circuits, tops of the connectors, and the plurality of scribe lines;

curing the liquid molding compound to solidify the molding compound;

removing a top portion of the cured molding compound so that the connectors extend above a top surface of the cured molding compound;

aligning with a first scribe line, a first saw blade having a first thickness;

after removing the top portion of the molding compound, sawing through a top portion of the cured molding compound while leaving a bottom portion of the cured molding compound remaining, thus forming a kerf in the top portion of the cured molding compound, wherein a bottom surface of the kerf is level with an interface between one of the solder balls and the patterned redistribution layer;

aligning a second saw blade to the kerf; and sawing through the bottom portion of the cured molding compound and sawing through a top major surface of the wafer using the second saw blade, the second saw blade having a second thickness different from the first thickness.

17. The method of claim 16, wherein the first thickness is about 40 to about 200 microns and the second thickness is about 15 to about 25 microns.

18. The method of claim 16, wherein the bottom portion of the cured molding compound has a thickness of from about 15 microns to about 35 microns.

19. The method of claim 16, wherein the first saw blade has a non-annular solid disk shape, and wherein the second saw blade has an annular shape different from the non-annular solid disk shape of the first saw blade.

20. The method of claim 16, wherein the first saw blade has an annular shape, and wherein the second saw blade has a non-annular solid disk shape different from the annular shape of the first saw blade.

* * * * *